United States Patent

Stroh et al.

[11] Patent Number: 5,991,965
[45] Date of Patent: Nov. 30, 1999

[54] APPARATUS FOR DRY-CLEANING DUST-CONTAMINATED AUXILIARY OBJECTS FOR HANDLING AND STORING SEMICONDUCTOR WAFERS

[75] Inventors: Ruediger Joachim Stroh, Freiburg; Bozenka Schweinoch, Teningen; Martin Trefzer, Ehrenkirchen-Kirchhofem; Uwe Thomas, Denzlingen; Erich Allmann, Winden, all of Germany; Craig Coad, Sands Point, Id.

[73] Assignee: Micronas Intermetall GmbH, Freiburg, Germany

[21] Appl. No.: 08/874,499

[22] Filed: Jun. 13, 1997

[30] Foreign Application Priority Data

Jun. 14, 1996 [DE] Germany .......................... 196 23 766

[51] Int. Cl.⁶ ................................ B08B 5/02; B08B 5/04
[52] U.S. Cl. ............................... 15/310; 15/302; 15/345
[58] Field of Search .............................. 15/310, 311, 302, 15/345, 346

[56] References Cited

U.S. PATENT DOCUMENTS

| 5,238,503 | 8/1993 | Phenix et al. ...................... 15/310 X |
| 5,351,360 | 10/1994 | Suzuki et al. ..................... 15/311 X |
| 5,806,138 | 9/1998 | Kawasaki ........................... 15/345 X |

FOREIGN PATENT DOCUMENTS

| 0702397 | 3/1996 | European Pat. Off. . |
| 4402247 | 1/1994 | Germany . |
| 97364 | 5/1986 | Japan ............................... 15/345 |

OTHER PUBLICATIONS

Patent Abstract of Japan, publication No. 06291003A, Oct. 18, 1994.
Patent Abstract of Japan, C–701, Mar. 14, 1990, vol. 14, No. 134.

Primary Examiner—Chris K. Moore
Attorney, Agent, or Firm—Arthur L. Plevy

[57] ABSTRACT

An apparatus for dry-leaning dust-contaminated auxiliary objects for handling and storing semiconductor wafers is disclosed and comprises a housing having a receiving opening and a closable lid for closing the opening. The housing further includes a receiving space for receiving an auxiliary object and a collecting space spatially separated therefrom, gas inlet nozzles having corresponding gas outlet openings in the receiving space for injecting a cleaning gas into the receiving space, and a gas draw-off opening in the collecting space for receiving the injected cleaning gas flowing from the receiving space to the collecting space. As the injected cleaning gas flows over the auxiliary object from the receiving space to the collecting space, the dust particles are removed from the auxiliary object by the flow of injected cleaning gas over the auxiliary object and delivered to said gas draw-off opening for disposal.

17 Claims, 1 Drawing Sheet

CROSS SECTIONAL VIEW OF DRY CLEANING APPARATUS

CROSS SECTIONAL VIEW OF DRY CLEANING APPARATUS

TOP VIEW OF DRY CLEANING APPARATUS LID

APPARATUS FOR DRY-CLEANING DUST-CONTAMINATED AUXILIARY OBJECTS FOR HANDLING AND STORING SEMICONDUCTOR WAFERS

FIELD OF THE INVENTION

The present invention relates to apparatus for cleaning semiconductor wafer auxiliary objects, and more particularly, to an apparatus for dry-cleaning dust-contaminated auxiliary objects for handling and storing semiconductor wafers.

BACKGROUND OF THE INVENTION

In semiconductor technology, electronic devices are formed on semiconductor wafers in a sequence of process steps under clean-room conditions. To handle and store the wafers, auxiliary objects are necessary. To achieve a good yield in the fabrication of electronic devices and a good quality of the electronic devices, steps must be taken to ensure that no dust particles can reach the wafer surface. This requires that the auxiliary objects for handling and storing the wafers, which come into direct contact with the wafers, should also be free of dust particles, for dust particles on the auxiliary objects may be transferred by such contact to the wafers. A typical example of an auxiliary object for handling semiconductor wafers are the so-called carriers, which are formed from quartz glass for particular applications. Such carriers consist, for example, of four long, interconnected quartz rods which are provided with slits and are so arranged that several wafers can be received by one quartz carrier, the wafers standing in the slits in a fixed position. In such quartz carriers, the wafers are transported to a further apparatus, such as a furnace, for carrying out a given process step. Dust particles are transferred by the contact between the wafer and the carrier and between the carrier and further transport means. As a result, the auxiliary objects, i.e., the quartz carriers, must be cleaned to minimize dust particle transfer.

It is common practice to blow the auxiliary objects clean with a nitrogen gun. This process, however, has the disadvantage that the dust particles are blown into the surrounding space, where they can settle on and contaminate other auxiliary objects or wafers. In addition, the reliability of this process depends on the operator, so that the cleaning process is not easily reproducible. It is also common practice to subject auxiliary objects, particularly quartz objects, to a wet cleaning process. However, such a process is very time-consuming. Moreover, wet cleaning roughens the surfaces of quartz parts, so that recontamination by dust particles is easily possible. Consequently, an improved cleaning apparatus which overcomes the aforementioned problems while still providing a high degree of dust particle removal is greatly desired.

SUMMARY OF THE INVENTION

It is an object of the present invention to provide an improved cleaning apparatus for dry-cleaning dust-contaminated auxiliary objects for handling and storing semiconductor wafers, the apparatus comprising a housing having a receiving opening and a closable lid for closing the opening, the housing having a receiving space for receiving the auxiliary object and a collecting space spatially separated therefrom, at least one gas inlet nozzle having a corresponding gas outlet opening in the receiving space for injecting a cleaning gas into the receiving space, and a gas draw-off opening in the collecting space for receiving the injected cleaning gas, wherein the injected cleaning gas flows over the auxiliary object from the receiving space to the collecting space, wherein dust particles are removed from the auxiliary object by the flow of injected cleaning gas over the auxiliary object and delivered to the gas draw-off opening for disposal.

This apparatus makes it possible to clean auxiliary objects for handling and storing semiconductor wafers in a reliable and simple manner. Since a dry-cleaning process is used, the disadvantages of wet cleaning, particularly a long cleaning time and roughening of the surfaces of the auxiliary objects, are avoided. As the auxiliary object is put into the closable housing for dry cleaning, no further objects or wafers in the clean room can be contaminated by dust particles. The dust particles are gathered in the collecting space of the housing, from which they can be removed by suction through the gas draw-off opening. Because of a suitable spatial arrangement and design of the gas inlet nozzle and the gas draw-off opening, the objects in the housing can be cleaned in a reliable and reproducible manner. The housing may be designed to receive one auxiliary object to be cleaned, but it may also be so designed that two or more auxiliary objects can be accommodated therein simultaneously and cleaned in one cleaning cycle. The gas inlet nozzles may then be distributed in the receiving space correspondingly.

In a further aspect of the invention, two or more gas inlet nozzles are arranged in the receiving space. In this manner, the stream of cleaning gas can be distributed more advantageously, so that the cleaning gas can flow around the auxiliary object more reliably.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Figure 1:
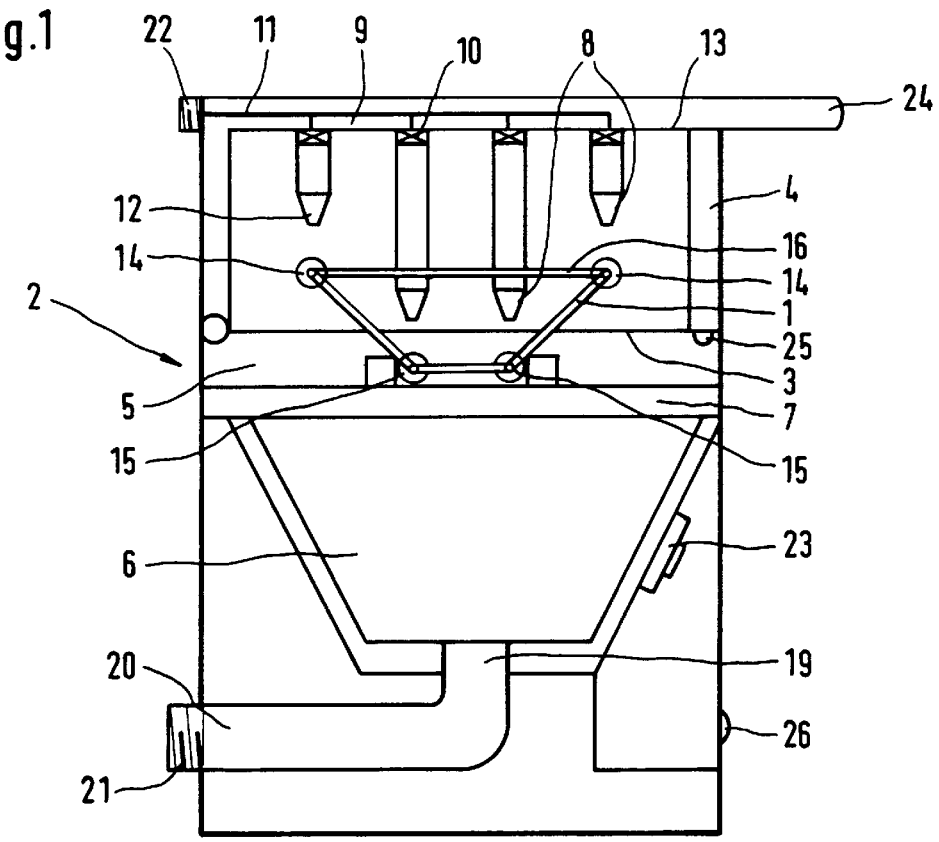
FIG. 1 is a cross section of a housing according to the invention with a carrier disposed therein.

FIG. 1 shows an apparatus for dry-cleaning a dust-contaminated carrier 1. The apparatus has a housing 2 with a receiving opening 3, which is closable with a lid 4. The housing 2 contains a receiving space 5 for a carrier 1 and a collecting space 6, which is spatially separated from the receiving space 5. The receiving space 5 comprises a support 7 on which the carrier 1 can be positioned. The support 7 may consist of suitably arranged rails shaped to permit the reception of carriers of different shapes. Furthermore, gas inlet nozzles 8 are provided in the receiving space 5. In the preferred embodiment, the gas inlet nozzles 8 are mounted in the lid 4 of the housing 2. In a wall of the housing, preferably in the lid 4, channels 9 for supplying the cleaning gas to the nozzles 8 are provided. This eliminates the need for supply lines outside the housing. The nozzles 8 are connected to channels 9 for supplying the cleaning gas, and comprise valves 10, which are controllable via a control line 11. In the preferred embodiment of the invention, two or more gas inlet nozzles are arranged in the receiving space 5. In this manner, the stream of cleaning gas can be distributed more advantageously, so that the cleaning gas can flow around the auxiliary object more reliably. The gas inlet nozzles 8 are so positioned on a surface 13 of the lid 4 that the gas outlet openings 12 are located at a fixed distance from the surface 13. This distance is chosen so as to define a predetermined distance of the gas outlet openings 12 from the carrier 1. The gas inlet nozzles may also be arranged at a predetermined angle to the surface of the housing to define a fixed angle with respect to the carrier to be cleaned. Particularly effective cleaning of the auxiliary object can be achieved by making the distance between the gas outlet openings and the carrier very small, for example, on the order of 10 mm. The arrangement and sizing of the gas inlet nozzles 8 may also be adapted to locate the gas outlet openings 12 at different distances from the housing. In this manner, the gas outlet openings can be adapted to the shape of the auxiliary object to be cleaned, enabling a more uniform and thorough cleaning process. The carrier 1 consists of four rods 14 and 15, which may be of quartz glass. They are connected with one another by connecting means 16. Two rods 14 and two rods 15 are arranged in respective horizontal planes. The gas inlet nozzles 8 are so arranged that their gas outlet openings 12 are located at a fixed distance from a respective one of the rods 14, 15.

Figure 2:
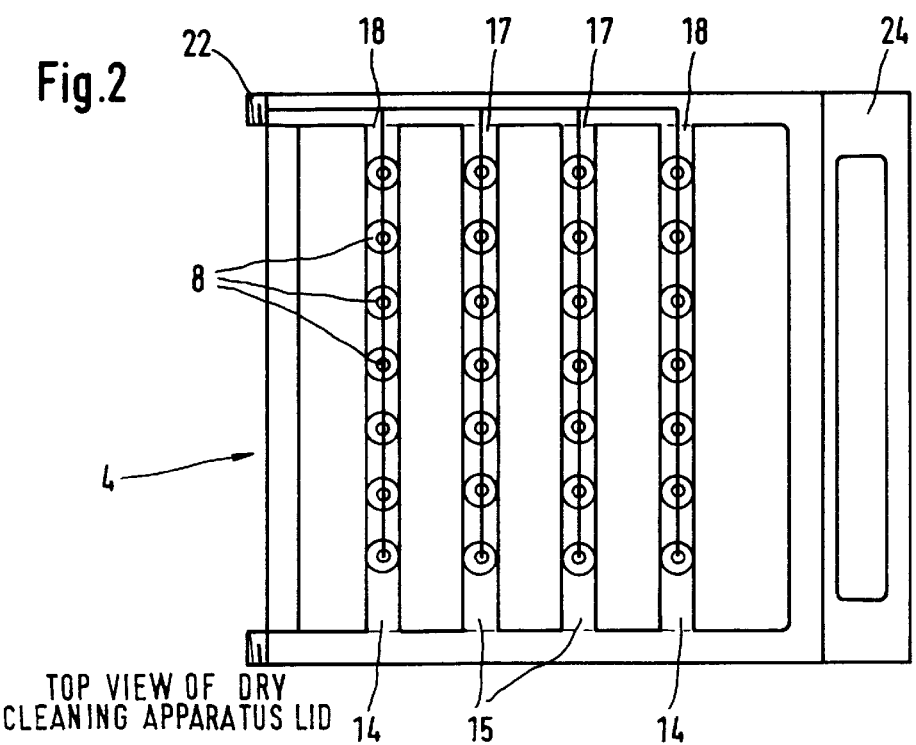
FIG. 2 is a top view of the lid of the housing of FIG. 1.

As can be seen in the top view illustration of the apparatus in FIG. 2, the gas inlet nozzles 8 are arranged in four rows 17, 18. In the preferred embodiment, the four rows of gas inlet nozzles are separated by the same distance as the rods of the quartz carrier. In this case, the distance between the gas inlet nozzles and the surface from which they start is chosen to be constant for every two rows of gas inlet nozzles. The difference from the two other rows is chosen according to the distance between the two planes of the quartz rods. When the quartz carrier is suitably positioned in the housing, a respective one of the rows of gas inlet nozzles is located above a respective rod of the quartz carrier at a short, predetermined distance from this rod. In accordance with this preferred embodiment, the gas inlet nozzles 8 of the outer rows 18 are shorter than the gas inlet nozzles 8 of the inner rows 17. The outer rods 14 in the upper horizontal plane of the carrier 1 are cleaned with the gas inlet nozzles 8 of the outer rows 18, and the rods 15 in the lower horizontal plane of the carrier 1 are cleaned with the gas inlet nozzles 8 of the inner rows 17. The collecting space 6 has a gas draw-off opening 19, from which a gas draw-off line 20 leads to the outside. At the outside of the housing 20 a connection 21 is provided for connecting a suction apparatus, such as a pump, a vacuum cleaner or the like. The lid 4 has connections for the control of the valves 10. The collecting space 6 is further provided with a regulating valve 23 for admitting ambient air.

As previously stated, FIG. 2 shows the lid 4 of FIG. 1 in a top view. Along the width of the lid, the gas inlet nozzles 8 are arranged in the four rows 14, 18. They are located above the rods 15, 16 of the carrier 1, so that the entire length of the rods 14, 15 can be cleaned. The lid 4 has a handle 24, by which the housing 2 can be opened and closed.

The operation of the apparatus according to the invention is as follows. The lid 4 of the housing 2 is opened with the handle 24. The carrier 1 is introduced through the receiving opening 3 into the receiving space 5 and positioned on the support 7. Then the lid 4 of the housing 2 is closed. By the closure, a switch 25 is operated, which starts the cleaning process. The closure also causes an indicator lamp 26 to be turned on, which indicates that the cleaning process is being carried out. At the start of the cleaning process, a cleaning gas is admitted to the channels 9. The pressure of the cleaning gas may be preset by a pressure-reducing valve in the supply line to ensure a constant and controllable pressure. During the cleaning process, as high a velocity of the cleaning gas as possible is to be achieved in the housing 2, since the cleaning effect is then greatest. A control device (not shown) causes the valves 10 of the gas inlet nozzles 8 to be operated successively in a predetermined order, for example row by row. Preferably, the valves 10 and gas inlet nozzles 8 are electronically controlled by the control device. The first valve is opened for a predetermined time Z1 and then closed. The second valve is opened after a time Z2, after which the original pressure has built up again in the channels 9. The second valve is opened for a further time period Z1 of the same length as in the case of the first valve, and then closed. After the time Z2, after which the pressure has built up again, the third valve is closed. This process is continued by the control device until all valves have been operated. Then the cycle can begin again with the first valve. This process of switching the valves closed before opening the next group of valves ensures that no cleaning gas is supplied to the housing during a short time interval T. Thus, in the channels of the valves to be opened, the entire pressure can build up again prior to the opening, so that a greater velocity of the cleaning gas is achieved. The cleaning process can thus be carried out several times in succession. The lengths of the times the valves are opened, the interval from the closure of one valve to the opening of the other, and the number of cleaning operations are predetermined and adapted to the conditions of the individual case. Such conditions include the degree of contamination of the carrier, the pressure in the gas supply line, suction power, number of valves, etc.

The start of the cleaning process also initiates the exhaustion through the gas draw-off opening 19. Preferably, the gas draw-off opening 19 has a pump device/suction apparatus (not shown) connected thereto, with which a partial vacuum can be created in the collecting space 6. This partial vacuum is a contributory factor in determining the amount of ambient air which is admitted to the collecting space via the regulating valve 23. The suction power is chosen so that the partial vacuum is created in the collecting space 6. Through the regulating valve 23, ambient air is admitted to the collecting space 6 and so regulated that it will be drawn off by the suction apparatus (not shown) through the gas draw-off opening 19. Thus, the ambient air only gets into the collecting space 6 of the housing, not into the receiving space 5. The cleaning gas emerging from the gas inlet nozzles 8 flows around the rods 15, 16 of the carrier 1, enters the collecting space 6, and is removed from there by suction. Through the partial vacuum in the collecting space 6 and through the ambient air entering through the regulating valve 23, additional turbulence is caused in the cleaning gas and the gas particles are accelerated. Through this arrangement, the velocity of the cleaning gas flowing through the housing is further increased. The higher the velocity of these gas particles can be set, the more effective the cleaning processing will be. The dust particles on the carrier 1, which are blown off by the cleaning gas, fall into the collecting space 6, from which they are removed by suction through the gas draw-off opening 19. Because of the partial vacuum existing there and the flow caused by the entering ambient air, the dust particles are entrained and any whirling-up, as a result of which they could get into the receiving space 5 again, is prevented. When the cleaning process is complete, the indicator lamp 26 is turned off by the control device. Then the lid 4 of the housing 2 is opened and the cleaned carrier 1 removed. Another carrier 1 can then be introduced into the receiving space 5 and the process described can begin again.

In the preferred embodiment, the housing 2 is made of an antistatic material, since this prevents the generation of electric charge as the cleaning gas flows through. This, in turn, prevents ionization of the cleaning gas flowing through the housing. Electrostatic charging can also be prevented by providing ionizers in the gas supply line, which serve to clean the gas. By using either of the two methods or a combination thereof, adhesion of dust particles to the cleaning apparatus and the carrier due to electrostatic attraction can be minimized and the separation of the electrostatically adhering particles favored.

In an alternative embodiment, cleaning gas, instead of ambient air, may be supplied to the collecting space 6 through regulating valve 23 from a pressure-compensated vessel (not shown) in which the gas pressure is slightly higher than the pressure of the ambient air and well below the gas pressure before the valves 10. In this manner, the particle contamination of the cleaning apparatus is minimized and the flow of the cleaning gas admitted through the valves 10 is not disturbed.

As can be seen from the preceding discussion, this apparatus makes it possible to clean auxiliary objects for handling and storing semiconductor wafers in a reliable and simple manner. Since a dry-cleaning process is used, the disadvantages of wet cleaning, particularly a long cleaning time and roughening of the surfaces of the auxiliary objects, are avoided. As the auxiliary object carrier 1 is put into the closable housing 2 for dry cleaning, no further objects or wafers in the clean room can be contaminated by dust particles. The dust particles are gathered in the collecting space 6 of housing 2, from which they can be removed by suction through the gas draw-off opening 19. Because of the suitable spatial arrangement and design of the gas inlet nozzles 8 and the gas draw-off opening 19, the carrier 1 in the housing can be cleaned in a reliable and reproducible manner. The housing may be designed to receive one auxiliary object carrier to be cleaned, but it may also be so designed that two or more carriers can be accommodated therein simultaneously and cleaned in one cleaning cycle. The gas inlet nozzles 8 may then be distributed in the receiving space 5 correspondingly.

It will be understood that a person skilled in the art may make many variations and modifications to the described embodiment utilizing functionally equivalent elements to those described. Any variations or modifications to the invention described hereinabove are intended to be included within the scope of the invention as defined by the appended claims.

What is claimed is:

1. Apparatus for dry-cleaning dust-contaminated auxiliary objects for handling and storing semiconductor wafers comprising:
    a housing including a receiving opening and a closable lid for closing said opening, a receiving space for receiving at least one said auxiliary object and a collecting space spatially separated therefrom;
    a plurality of gas inlet nozzles each having a corresponding gas outlet opening in said receiving space for injecting a cleaning gas into said receiving space;
    channels for supplying said cleaning gas to said gas inlet nozzles, said channels provided in a wall of said housing; and,
    a gas draw-off opening in said collecting space for receiving said injected cleaning gas;
    wherein said injected cleaning gas flows over said auxiliary object from said receiving space to said collecting space, wherein dust particles are removed from said auxiliary object by said flow of injected cleaning gas over said auxiliary object and delivered to said gas draw-off opening for disposal.

2. The apparatus according to claim 1, wherein each of said gas outlet openings is arranged at a predetermined distance from a surface of said housing.

3. The apparatus according to claim 2, wherein each said gas outlet opening is arranged at a predetermined angle from a surface of said housing.

4. The apparatus according to claim 1, wherein each of said gas inlet nozzles is arranged such that each said gas outlet opening is spaced a different distance from a surface of said housing.

5. The apparatus according to claim 1, wherein each of said gas inlet nozzles is arranged in said lid of said housing.

6. The apparatus according to claim 1, wherein each of said gas inlet nozzles is movable relative to a surface of said housing.

7. The apparatus according to claim 1, wherein said housing further includes a switching element for starting and terminating a dry-cleaning process, wherein said switching element is responsive to closing said lid of said housing and is operable to start said dry-cleaning process.

8. The apparatus according to claim 1, further including a gas supply line connected to said channels for supplying said cleaning gas to said inlet nozzles, said gas supply line having a pressure regulator for controlling the pressure of said injected cleaning gas.

9. The apparatus according to claim 1, wherein said housing is made of an antistatic material.

10. The apparatus according to claim 1, wherein said receiving space includes a support for positioning said auxiliary object for dry-cleaning, wherein said support is adaptable to receive auxiliary objects of different sizes and shapes.

11. An apparatus for dry-cleaning dust-contaminated auxiliary objects for handling and storing semiconductor wafers comprising:
    a housing including a receiving opening, a closable lid for closing said opening, a receiving space for receiving at least one said auxiliary object and a collecting space spatially separated therefrom;
    at least one gas inlet nozzle having a corresponding gas outlet opening in said receiving space for injecting a cleaning gas into said receiving space;
    a gas draw-off opening in said collecting space for receiving said injected cleaning gas; and,
    a control device having a plurality of modes for controlling valves operable to supply said cleaning gas to each said corresponding gas inlet nozzle, wherein said valves are controllable such that said cleaning gas is supplied through individual valves in response to a first mode of said control device, and said cleaning gas is supplied through groups of said valves successively in response to a second mode of said control device;
    wherein said injected cleaning gas flows over said auxiliary object from said receiving space to said collecting space, wherein dust particles are removed from said auxiliary object by said flow of injected cleaning gas over said auxiliary object and delivered to said gas draw-off opening for disposal.

12. The apparatus according to claim 11, wherein said valves are switchable by said control device such that one valve or one group of valves is closed prior to opening said next valve or next group of valves, thereby defining a time interval wherein no cleaning gas is supplied to said housing.

13. The apparatus according to claim 11, wherein each said gas inlet nozzle is operable several times during a time period wherein said auxiliary object is dry-cleaned.

14. The apparatus according to claim 11, wherein each of said gas inlet nozzles is electronically controllable by said control device.

15. An apparatus for dry-cleaning dust-contaminated auxiliary objects for handling and storing semiconductor wafers comprising:
- a housing including a receiving opening, a closable lid for closing said opening, a receiving space for receiving at least one said auxiliary object and a collecting space spatially separated therefrom;
- at least one gas inlet nozzle having a corresponding gas outlet opening in said receiving space for injecting a cleaning gas into said receiving space;
- a gas draw-off opening in said collecting space for receiving said injected cleaning gas; and,
- a regulating valve for admitting ambient air into said collecting space;
- wherein said injected cleaning gas flows over said auxiliary object from said receiving space to said collecting space, wherein dust particles are removed from said auxiliary object by said flow of injected cleaning gas over said auxiliary object and delivered to said gas draw-off opening for disposal.

16. The apparatus of claim 15, wherein said gas draw-off opening includes a pump device connected thereto for creating a partial vacuum in said collecting space to suction said gases into said collecting space.

17. The apparatus according to claim 15, wherein said regulating valve is connected to a pressure-compensating vessel and operable to admit a second cleaning gas to said collecting space, wherein said second cleaning gas pressure is below said injected cleaning gas pressure, said second cleaning gas combining with said injected cleaning gas in said collector space to reduce particle contamination of said apparatus.

* * * * *